(12) United States Patent
Han et al.

(10) Patent No.: US 7,303,141 B2
(45) Date of Patent: Dec. 4, 2007

(54) GAS SUPPLYING APPARATUS

(75) Inventors: Kyu-hee Han, Kunpo (KR);
Sang-wook Yoo, Suwon (KR);
Suk-chan Lee, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 206 days.

(21) Appl. No.: 10/801,852

(22) Filed: Mar. 17, 2004

(65) Prior Publication Data

US 2004/0217217 A1 Nov. 4, 2004

(30) Foreign Application Priority Data

Apr. 9, 2003 (KR) ...................... 10-2003-0022366

(51) Int. Cl.
*B05B 17/00* (2006.01)
(52) U.S. Cl. .................. 239/1; 239/390; 239/543; 239/545; 239/549; 239/561; 239/567; 239/600; 118/715
(58) Field of Classification Search ................ 239/390, 239/391, 556, 543, 545, 600, 8, 559, 567, 239/566, 562, 407, 413, 419, 433, 591, 548, 239/549, 561; 118/715; 156/345.33
See application file for complete search history.

(56) References Cited

U.S. PATENT DOCUMENTS

| | | | |
|---|---|---|---|
| 5,772,771 A | 6/1998 | Li et al. | |
| 5,851,294 A * | 12/1998 | Young et al. | ............... 118/715 |
| 6,012,591 A | 1/2000 | Brandenberg | |
| 6,143,078 A | 11/2000 | Ishikawa et al. | |
| 6,197,683 B1 * | 3/2001 | Kang et al. | .................. 438/643 |
| 6,251,187 B1 | 6/2001 | Li et al. | |
| 6,263,829 B1 | 7/2001 | Schneider et al. | |
| 6,270,862 B1 * | 8/2001 | McMillin et al. | ........... 427/569 |
| 6,395,643 B1 | 5/2002 | Knoot | |
| 6,486,081 B1 | 11/2002 | Ishikawa et al. | |
| 6,818,249 B2 * | 11/2004 | Derderian | ................ 427/248.1 |
| 2002/0104622 A1 | 8/2002 | De | |

FOREIGN PATENT DOCUMENTS

| | | |
|---|---|---|
| EP | 0413239 B1 | 2/1991 |
| EP | WO 00/30158 | 5/2000 |
| JP | 2002-530860 | 9/2002 |
| KR | 20-205574 | 9/2000 |
| KR | 2001-19989 | 3/2001 |
| KR | 2002-27375 | 4/2002 |
| KR | 2002-28921 | 4/2002 |

OTHER PUBLICATIONS

Japanese Office for Japanese Patent Application No. 2003-349921 dated Oct. 3, 2006 which corresponds to the present application.

* cited by examiner

*Primary Examiner*—Steven J. Ganey
(74) *Attorney, Agent, or Firm*—Staas & Halsey LLP

(57) ABSTRACT

A gas supplying apparatus for supplying deposition gas onto a substrate surface, the gas supplying apparatus comprising: a gas supplying ring with one or more gas supplying channels formed along the interior of the gas supplying ring and with a plurality of gas distribution channels directed toward a center of the gas supplying ring; and a plurality of adapters with gas nozzles connecting to the gas distribution channels, respectively, that detachably connect to the interior of the gas supplying ring, wherein the gas nozzles have a variety of injection configurations.

31 Claims, 18 Drawing Sheets

GAS SUPPLYING APPARATUS

CROSS-REFERENCE TO RELATED APPLICATIONS

This application claims the benefit of Korean Patent Application No. 2003-22366, filed Apr. 9, 2003, in the Korean Intellectual Property Office, the disclosure of which is incorporated herein by reference.

BACKGROUND OF THE INVENTION

1. Field of the Invention

The present invention relates to a gas supplying apparatus, and, more particularly, to a gas supplying apparatus for supplying deposition gas onto a surface of a substrate located in a chamber.

2. Description of the Related Art

A gas supplying apparatus is used for supplying gas to be deposited on a surface of a substrate, such as a wafer positioned in a chamber in a manufacturing process of a semiconductor. In general, the gas supplying apparatus is required to uniformly distribute gas on the substrate surface.

A conventional gas supplying apparatus is disclosed in U.S. Pat. No. 6,143,078, specifying a gas supplying apparatus in a CVD (chemical vapor deposition) manufacturing process. As shown in FIG. 12, the gas supplying apparatus that deposits a thin film onto a substrate includes a plurality of ports provided in a gas distribution ring 410 in a processing chamber, a plurality of first gas nozzles 404 disposed in some of the ports for injecting a first gas a predetermined distance, and a plurality of second gas nozzles 402 disposed at others of the ports for injecting a second gas for another predetermined distance.

The first and the second gas nozzles 404 and 402 are fixed at the gas supplying ring 410 at different angles, respectively.

Thus, different gases can be injected into the chamber through the first and the second gas nozzles 404 and 402, respectively.

Substrates of various sizes have been developed, so that gas nozzles of various injection positions and angles are needed for uniform gas deposition onto the substrates.

However, in the conventional gas supplying apparatus described above, the first gas nozzles 404 and the second gas nozzles 402 positioned in the gas supplying ring 410 are fixed at different angles. Thus, it is difficult to adapt the injection positions or injection angles for a variety of substrates, thereby causing a problem in that a uniform and optimal injection onto the variety of substrates cannot be accomplished.

SUMMARY OF THE INVENTION

It is an aspect of the present invention to provide a gas apparatus capable of uniformly and optimally injecting gas onto a variety of substrates.

Additional aspects and/or advantages of the invention will be set forth in part in the description that follows and, in part, will be obvious from the description, or may be learned by practice of the invention.

To achieve the above and/or other aspects of the present invention, there is provided a gas supplying apparatus for supplying deposition gas onto a substrate surface, the gas supplying apparatus including a gas supplying ring with one or more gas supplying channels formed along the interior of the gas supplying ring and with a plurality of gas distribution channels directed toward a center of the gas supplying ring; and a plurality of adapters with gas nozzles connecting to the gas distribution channels, respectively, that detachably connect to the interior of the gas supplying ring, wherein the gas nozzles have a variety of injection configurations.

The injection configuration of the gas nozzles is changed by changing at least one of an injection angle and an injection position.

Each adapter includes a gas connecting channel connecting to respective gas distribution channels, wherein the gas supplying ring has a plurality of the gas supplying channels, and the adapters are formed vertically to connect to the gas connecting channel.

The gas supplying apparatus further includes a blocking device for selectively blocking the gas distribution channels.

The blocking device further includes a plurality of blocking members that are selectively inserted into the plurality of gas distribution channels, respectively, to block the plurality of gas distribution channels.

The gas supplying ring includes a plurality of adapter accommodating parts to accommodate the adapters, respectively.

The gas supplying apparatus further includes a plurality of blocking member accommodating parts formed at outlets of the gas distribution channels that respectively accommodate the blocking members.

The gas supplying apparatus includes a plurality of supplementary gas nozzles detachably connected to the adapters, respectively, to connect to the gas nozzles.

Each of the adapters includes a supplementary gas nozzle holder connecting to the gas nozzles, to hold the supplementary gas nozzles, respectively.

The supplementary gas nozzles are positioned at predetermined angles with respect to a gas injection direction of the gas nozzles.

The gas nozzles extend horizontally into the gas connecting channel toward a center of the gas connecting channel.

The gas nozzles slope downward from the gas connecting channel.

The gas nozzles slope upward from the gas connecting channel.

To achieve the above and/or other aspects of the present invention, there is provided a gas supplying apparatus for supplying gas onto a substrate, including a gas supplying ring comprising, a gas supplying channel formed in an interior of the gas supplying ring, and a plurality of gas distribution channels connecting to the gas supplying channel and extending toward a center of the gas supplying ring; a plurality of adapters with gas nozzles respectively connecting to the gas distribution channels, the adapters detachably connecting to the interior of the gas supplying ring; and a plurality of supplemental gas nozzles detachably connecting to the gas nozzles of the adapters, respectively, at various injection angles.

To achieve the above and/or other aspects of the present invention, there is provided a method of supplying gas to a substrate using a gas supplying apparatus, the gas supplying apparatus having a gas supplying ring with a first gas distribution channel and a second gas distribution channel, detachable adapters with gas nozzles having various injection positions and injection angles with respect to the adapters, the gas nozzles connecting to the first gas distribution channel and the second gas distribution channel, the method including blocking one of the first gas distribution channel and the second gas distribution channel; determining a desired gas nozzle injection position and injection angle according to a type of the substrate; selecting ones of the adapters according to the desired gas nozzle injection position and injection angle; attaching the selected adapters to the gas ring; and injecting gas toward the substrate through the selected adapters according to the desired gas nozzle injection position and injection angle.

These, together with other aspects and/or advantages that will be subsequently apparent, reside in the details of construction and operation as more fully hereinafter described and claimed, reference being had to the accompanying drawings forming a part thereof, wherein like numerals refer to like parts throughout.

BRIEF DESCRIPTION OF THE DRAWINGS

These and/or other aspects and advantages of the invention will become apparent and more readily appreciated from the following description of the preferred embodiments, taken in conjunction with the accompanying drawings, of which.

DETAILED DESCRIPTION OF THE PREFERRED EMBODIMENTS

Figure 1:
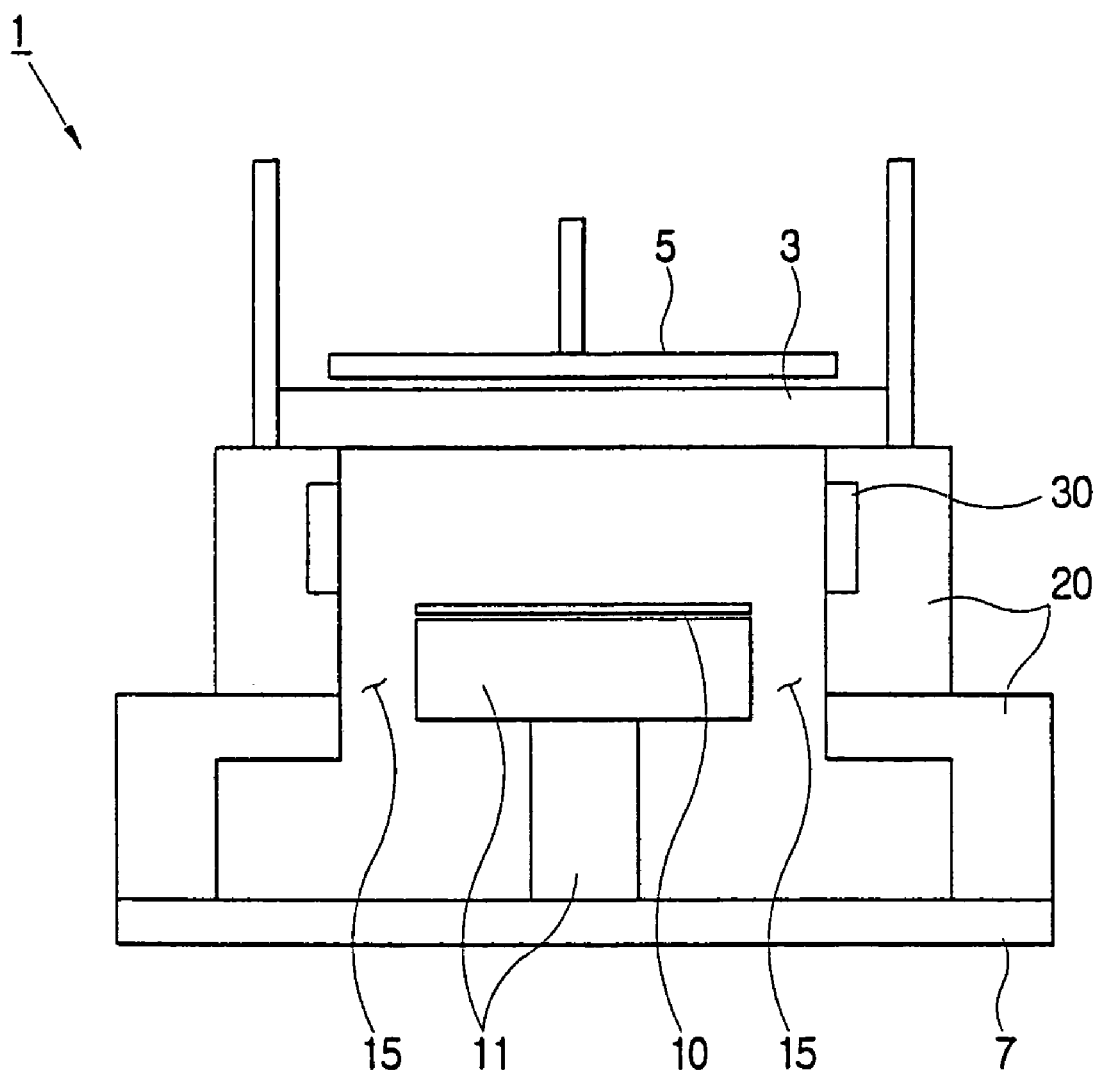
FIG. 1 is a sectional view of a chamber provided with a gas supplying apparatus according to a first embodiment of the present invention.

Hereinafter, embodiments of the present invention will be described in detail with reference to the attached drawings, wherein the like reference numerals refer to the like elements throughout. The present invention may, however, be embodied in many different forms and should not be construed as being limited to the embodiments set forth herein. Rather, these embodiments are provided so that the present disclosure will be thorough and complete, and will fully convey the concept of the invention to those skilled in the art.

FIG. 1 is a sectional view of a chamber 1 provided with a gas supplying apparatus 20 according to a first embodiment of the present invention. As shown in FIG. 1, the chamber 1 includes a base 7; a ring-shaped gas supplying apparatus 20 mounted on the base 7; a substrate holder 11 that is located in the middle of the interior of the gas supplying apparatus 20 and holds the substrate 10, which is a wafer; a ceramic board 3 mounted on the gas supplying apparatus 20; a plasma antenna 5 mounted on the ceramic board 3; a substrate supplying instrument (not shown) for placing a substrate 10 located outside the chamber onto the substrate holder 11; and a gas discharging part 15 for discharging gas supplied from the gas supplying apparatus 20.

The plasma antenna 5 positioned on the ceramic board 3 has a coil type copper wire to which alternating current is supplied. The plasma antenna 5 converts the gas into a plasma state for a simple deposition of the gas, supplied from the gas supplying apparatus 20 into the chamber 1, onto the substrate 10.

Figure 2:
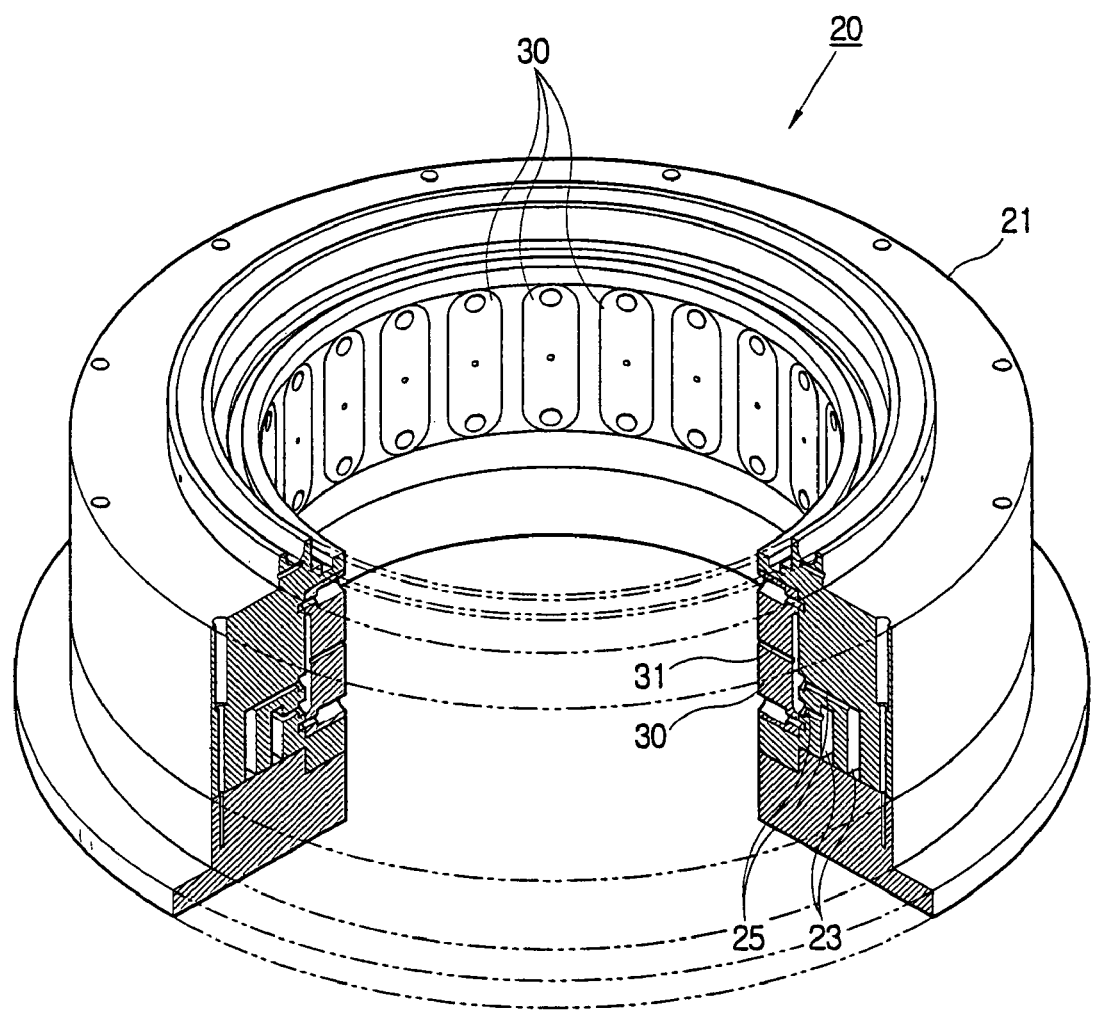
FIG. 2 is a partial cut-away perspective view of the gas supplying apparatus of FIG. 1.
Figure 3:
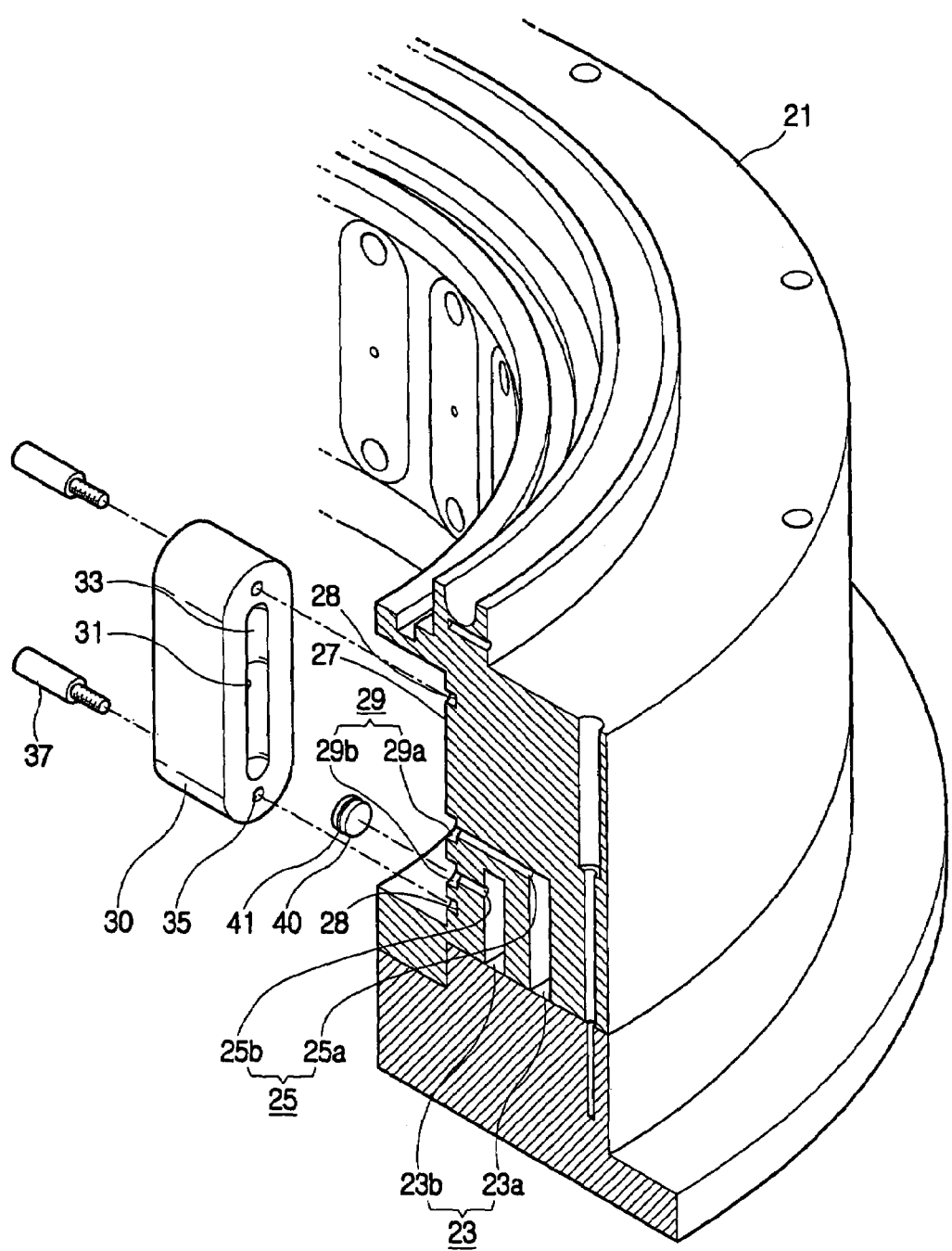
FIG. 3 is a partial exploded perspective view of the gas supplying apparatus of FIG. 1.
Figure 4:
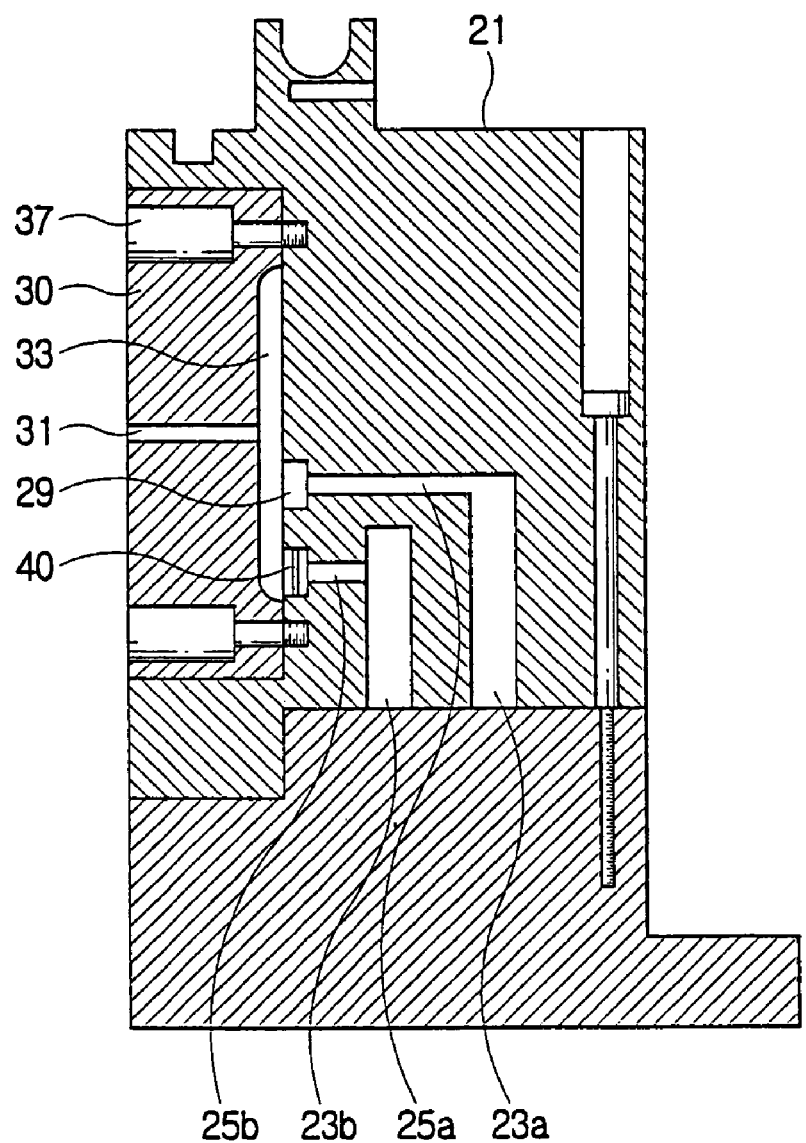
FIG. 4 is a sectional view of the gas supplying apparatus of FIG. 1.

As shown in FIGS. 2 through 4, the gas supplying apparatus 20 according to the first embodiment of the present invention includes a gas supplying ring 21 having one or more gas supplying channels 23 and a plurality of gas distribution channels 25, and a plurality of adapters 30 detachably connected to the interior of the gas supplying ring 21. Each adapter 30 has a gas nozzle 31 that respectively connects to the gas distribution channels 25.

The gas supplying channels 23 are formed in rings along the interior circumference of the gas supplying ring 21, and the plurality of gas distribution channels 25 extend toward the center of the gas supplying ring 21. The gas supplying ring 21 can be separated into an upper part and a lower part that are combined, forming the gas supplying channels 23. In the gas supplying ring 21, a plurality of adapter accommodating parts 27 for respectively accommodating each adapter 30 may be formed. Further, the gas supplying ring 21 includes a blocking device (described below) for selectively blocking the plurality of gas distribution channels 25.

Multiple gas supplying channels 23 may be provided for supplying different gases. In the first embodiment, a first gas supplying channel 23a and a second gas supplying channel 23b provide first and second gases, respectively. Gases are supplied to the gas supplying channel 23 by being connected to gas supplying units (not shown) located outside of the gas supplying apparatus 20.

The gas distribution channels 25 include a plurality of first gas distribution channels 25a connecting to the first gas supplying channel 23a to supply a first gas from the first gas supplying channel 23a into the interior circumference of the chamber 1, and a plurality of second gas distribution channels 25b connecting to the second gas supplying channel 23b for supplying a second gas from the second gas supplying channel 23b into the interior circumference of the chamber 1. The blocking device may be positioned at the ends of the gas distribution channels 25 to block the gas distribution channels 25.

Each adapter accommodating part 27 is a cavity in the interior of the gas supplying ring 21 and corresponds to the shape of each adapter 30, which connects to the first gas distribution channel 25a and the second gas distribution channel 25b, respectively. The adapter accommodating part 27 is formed with a screw hole 28 to which a screw 37 is inserted through the through hole 35 of the adapter 30.

The blocking device includes a plurality of blocking members 40, which may be selectively inserted in one or more gas distribution channels 25 to block the gas distribution channels 25. The blocking device may be a valve, for example, to selectively block the gas distribution channels 25.

Each blocking member 40 may be formed at the outlet of each gas distribution channel 25 in the adapter accommodating part 27 and inserted into a blocking member accommodating part 29, which is a cavity that corresponds to the blocking member 40. The blocking member 40 has a cylindrical shape, for example, and may be provided in the middle of the gas distribution channel 25, with an O-ring 41 preventing the escape of gas. A plurality of O-rings may be provided.

The blocking member accommodating part 29 includes a first blocking member accommodating part 29a provided at the outlet of the first gas distribution channel 25a and a second blocking member accommodating part 29b provided at the outlet of the second gas distribution channel 25b.

Thus, each blocking member 40 can selectively block either the first blocking member accommodating part 29a or the second blocking member accommodating part 29b, the first blocking member accommodating part 29a and the second blocking member accommodating part 29b being formed in the interior of the adapter accommodating part 27.

The adapters 30 are detachably connected to the adapter accommodating parts 27 formed in the gas supplying ring 21. The gas nozzles 31 of the adapters 30 have a variety of designs for a variety of injection configurations. The gas injection configurations may be changed by changing at least one of the injection position and the injection angle. The adapters 30 are vertically attached to the adapter accommodating parts 27. Each adapter 30 includes a gas connecting channel 33 that connects to the first gas distribution channel 25a and with the second gas distribution channel 25b. Each adapter 30 has a pair of through holes 35 through which the screws 37 are inserted in the screw holes 28 of the adapter accommodating part 27. Then, each adapter 30 can be detachably connected to the gas supplying ring 21.

The gas connecting channel 33 is a vertical cavity in the adapter 30 that is adjacent to the outlet of the gas distribution channel 25 to allow the first gas distribution channel 25a and the second gas distribution channel 25b to connect to the gas nozzle 31. Because of the vertical disposition of the gas connecting channel 33, the gas injection position can be varied, as described below.

FIGS. 5A through 7B show the adapters 30 provided with a variety of positions and angles of the gas nozzles 31.

Figure 5A:
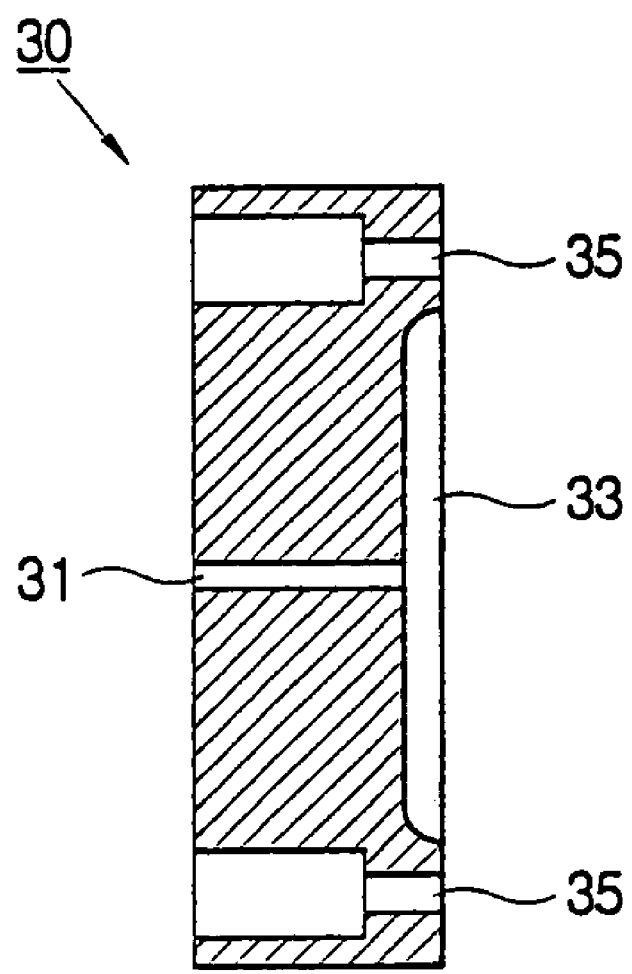
FIGS. 5A through 7B are sectional views of gas nozzles in various forms provided in an adapter installed in the gas supplying apparatus of FIG. 1.
Figure 5B:
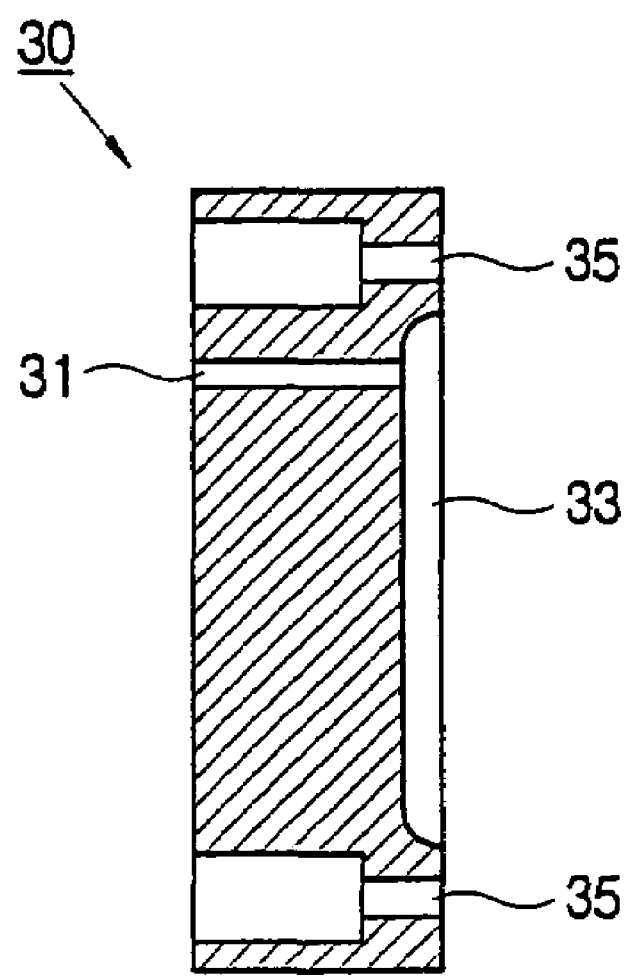
Figure 5C:
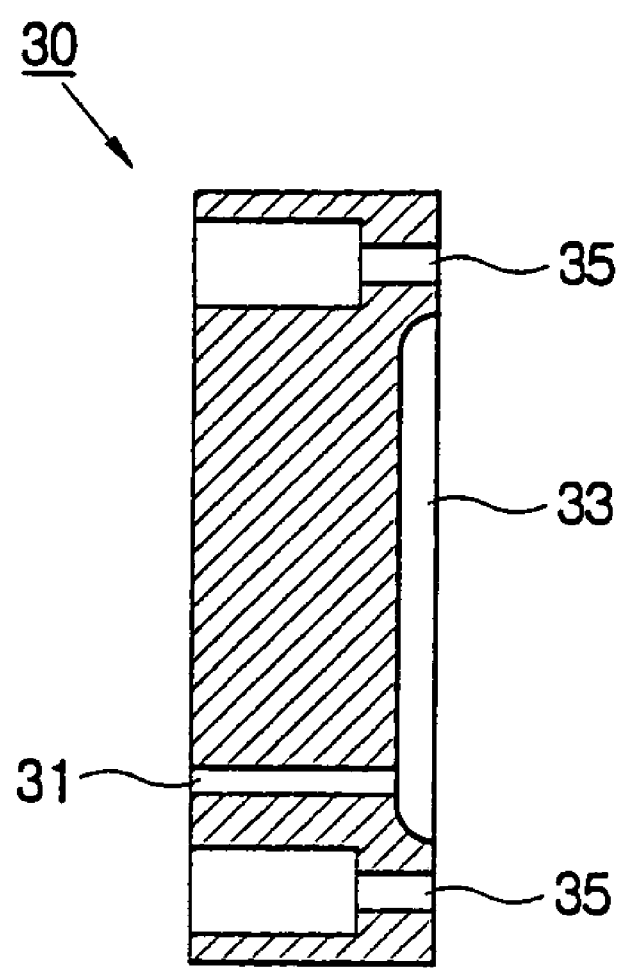

In FIGS. 5A through 5C, the gas nozzles 31 extend horizontally into the gas connecting channel 33. The gas nozzles 31 may be formed in the middle of the adapter 30 (see FIG. 5A), in the upper part of the adapter 30 (see FIG. 5B), or in the lower part of the adapter 30 (see FIG. 5C).

Figure 6A:
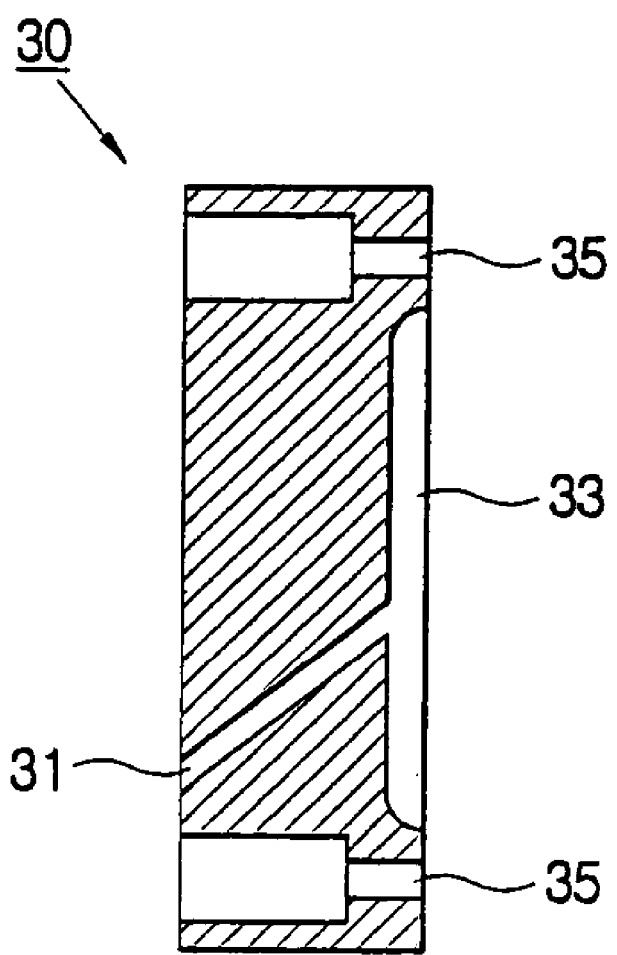
Figure 6B:
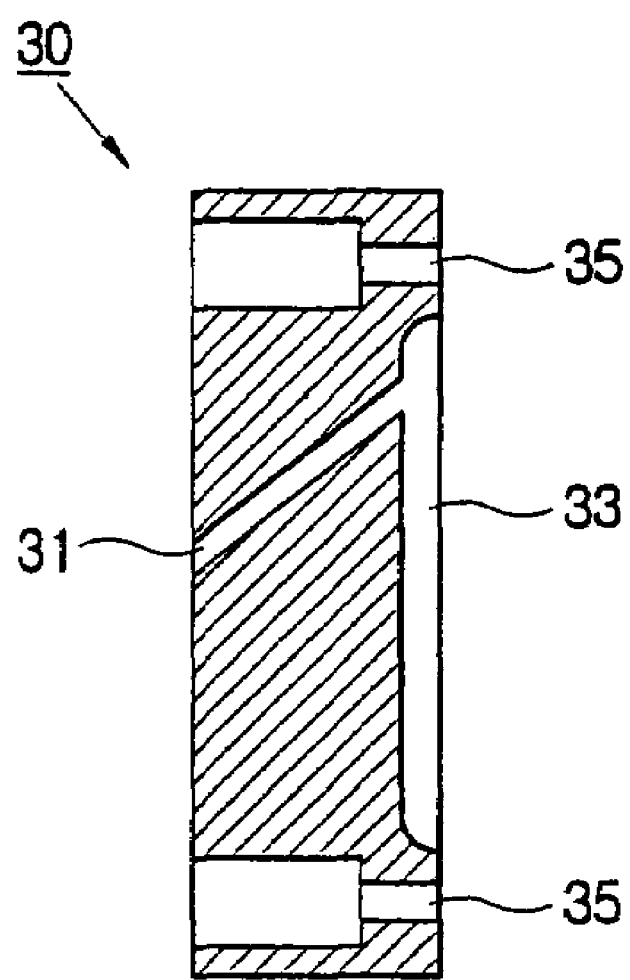

In FIGS. 6A and 6B, the gas nozzles 31 slope upward into the gas connecting channel 33. The gas nozzles 31 may be formed in the lower part of the adapter 30 (see FIG. 6A) or in the upper part of the adapter 30 (see FIG. 6B).

Figure 7A:
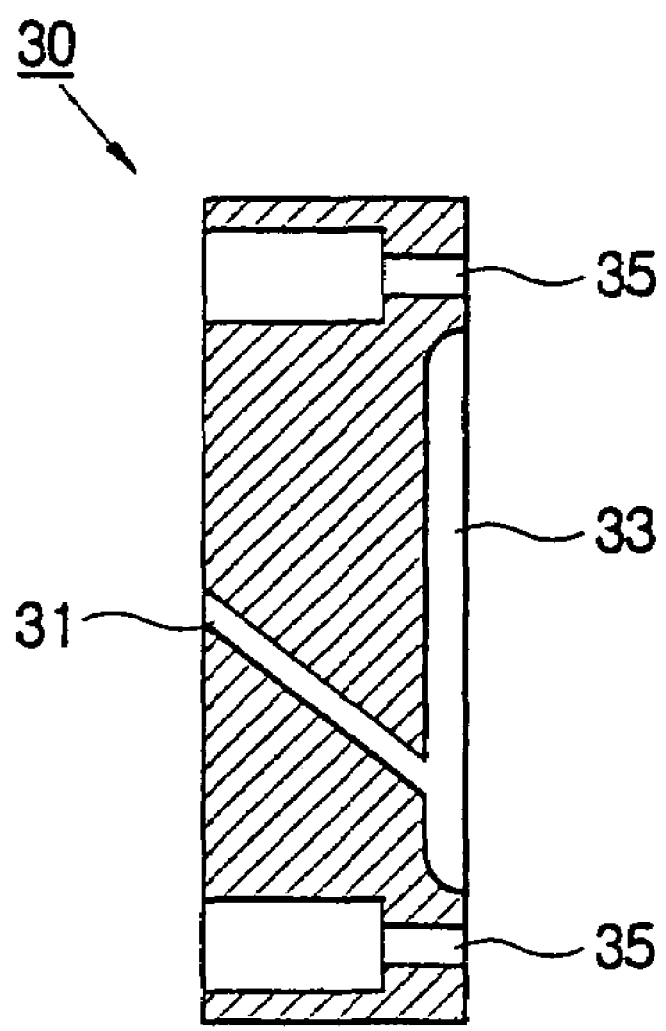
Figure 7B:
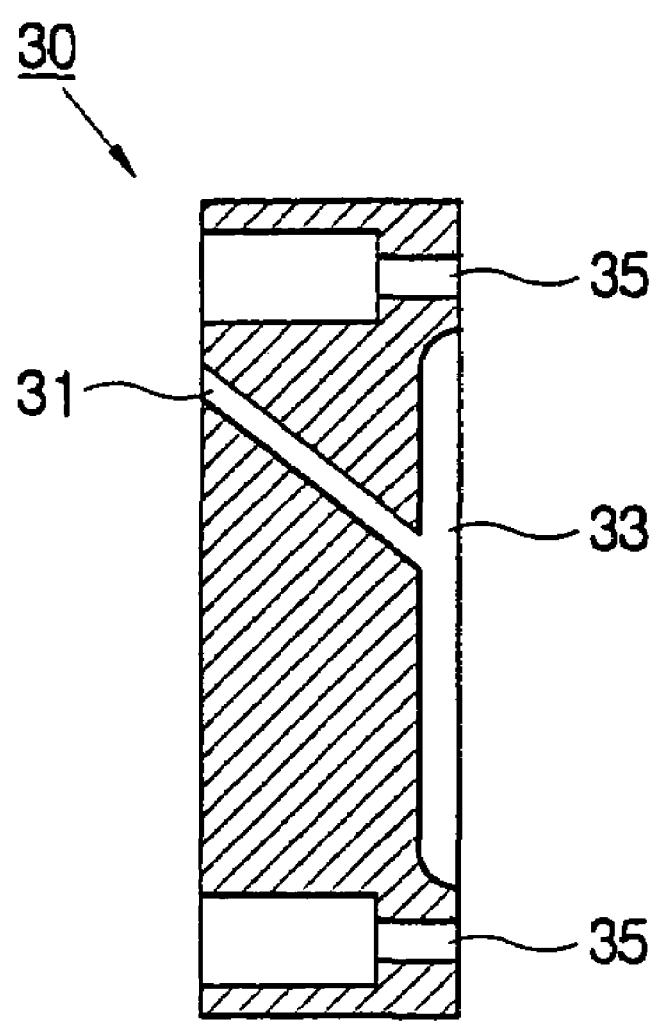

In FIGS. 7A and 7B, the gas nozzles 31 slope downward into the gas connecting channel 33. The gas nozzles 31 may be formed in the lower part of the adapter 30 (see FIG. 7A) or in the upper part of the adapter 30 (see FIG. 7B).

The operation of the gas supplying apparatus 20 according to the first embodiment of the present invention is described as follows.

First, one of the first gas distribution channel 25a and the second gas distribution channel 25b is blocked using the blocking member 40. One of the adapters 30 having one of the gas nozzles 31 with the desired gas nozzle injection position and injection angle, as described above, is selectively connected to the adapter accommodating part 27. Then, gas is injected toward the substrate 10 mounted on the substrate holder 11 according to the chosen gas injection position and angle. If the type of substrate 10 is changed, the adapters 30 having the various configurations can be used and tested to determine the most suitable injection configuration.

In the gas supplying apparatus 20 according to the first embodiment of the present invention, the adapters 30 having the gas nozzles 31 with the various configurations can be easily detached and attached, selectively. Thus, a uniform and most suitable gas distribution on various substrates is provided.

Figure 8:
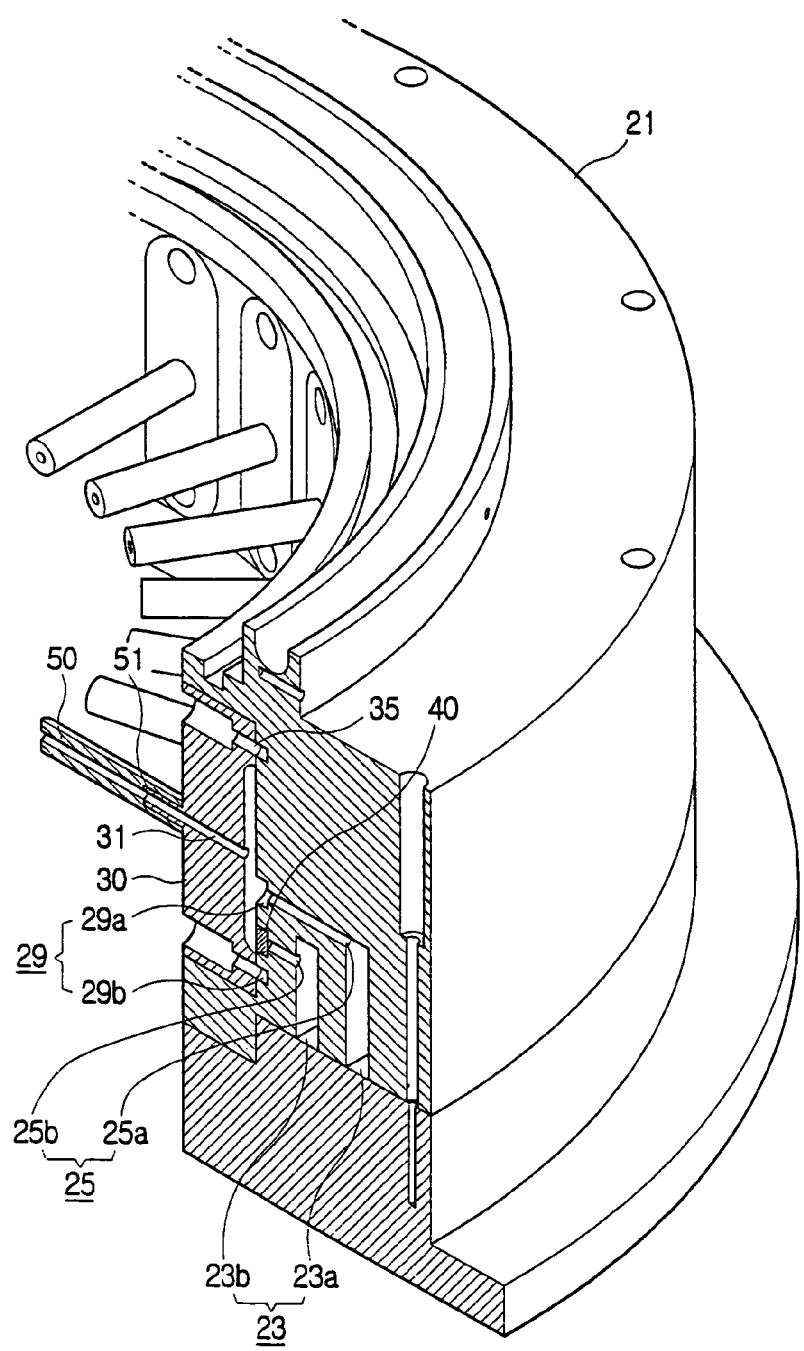
FIG. 8 is a partial perspective view of a gas supplying apparatus according to a second embodiment of the present invention.
Figure 9:
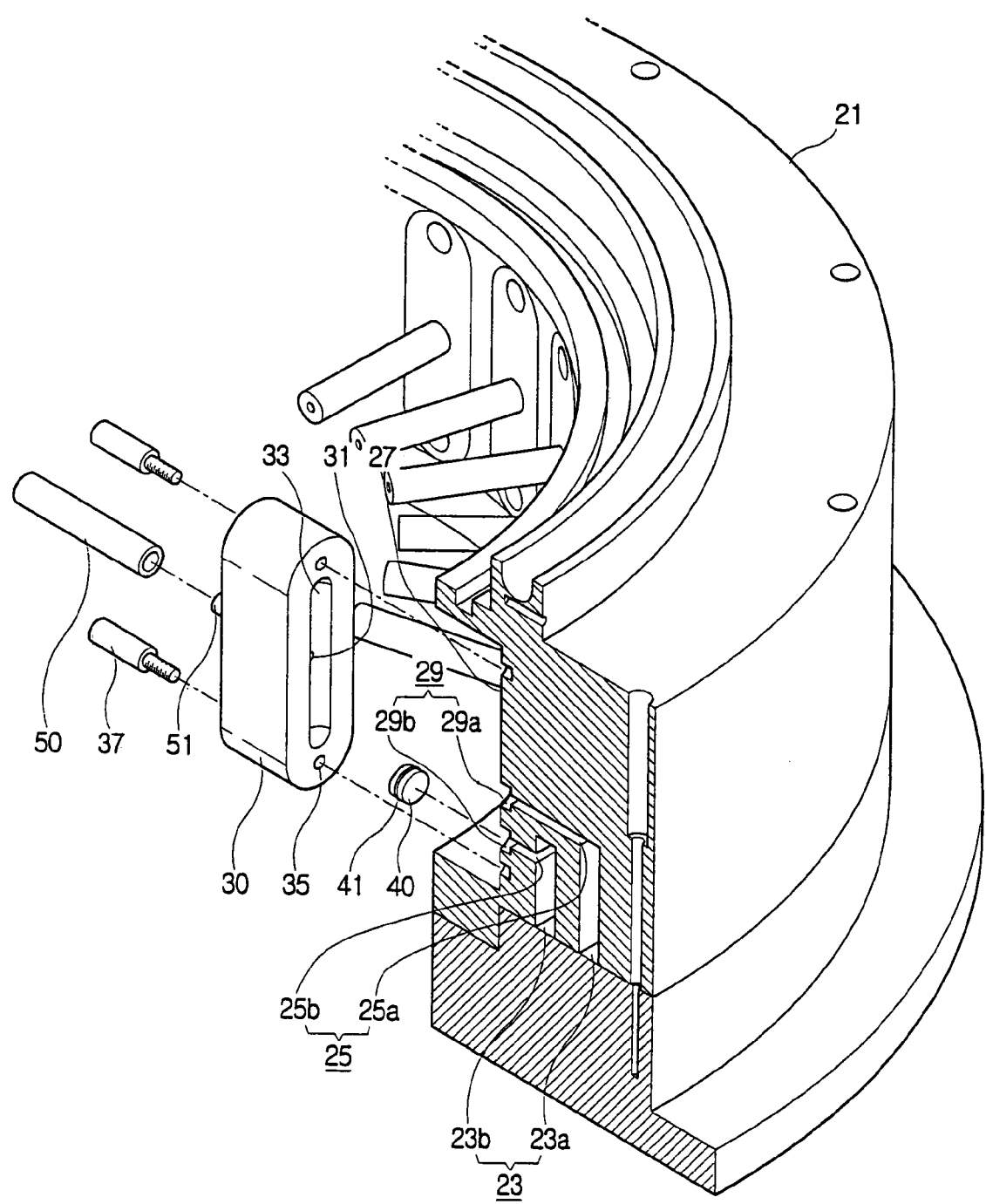
FIG. 9 is a partial exploded perspective view of the gas supplying apparatus of FIG. 8.

FIG. 8 is a perspective view of the gas supplying apparatus 20 according to a second embodiment of the present invention and FIG. 9 is a partial exploded perspective view thereof.

The gas supplying apparatus 20 of the second embodiment differs from that of the first embodiment in that a plurality of supplementary gas nozzles 50 detachably connected to the adapters 30 are provided at the outlets of the gas nozzles 31 for connecting to the gas nozzles 31.

The supplementary gas nozzles 50 have a predetermined length. The adapters 30 include supplementary gas nozzle holders 51 that connect to the gas nozzles 31 and hold the supplementary gas nozzles 50.

Figure 10A:
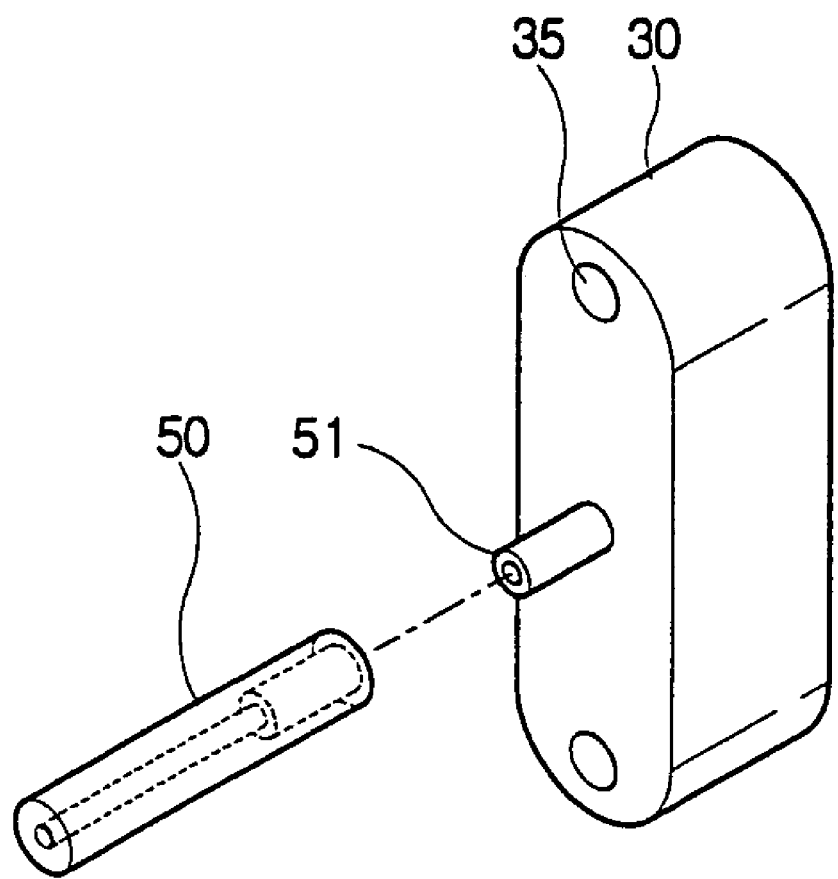
FIGS. 10A through 10C are perspective views of gas nozzles in various forms provided in an adapter installed in the gas supplying apparatus of FIG. 8.
Figure 10B:
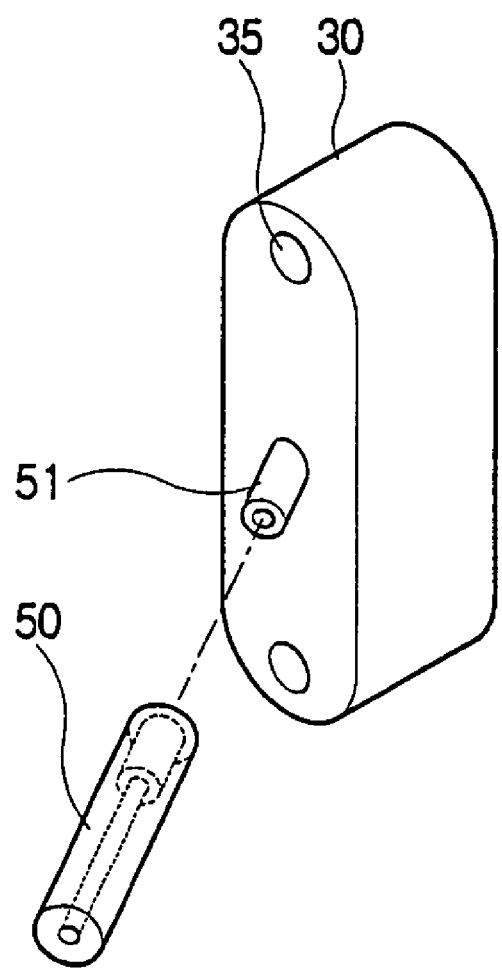
Figure 10C:
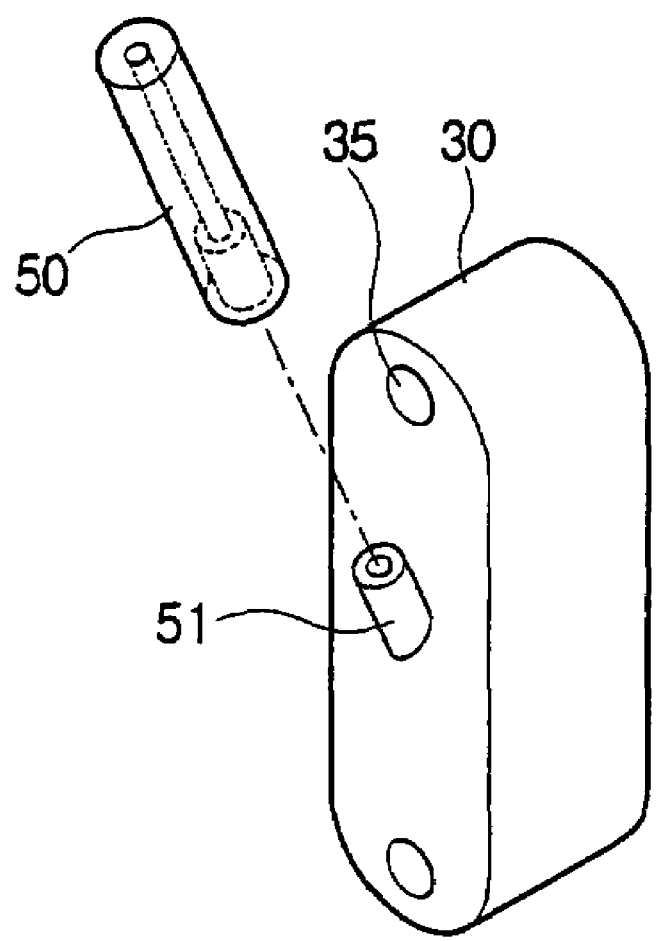

The supplementary gas nozzle holders 51 may have a variety of angles with respect to the adapters 30 (see FIGS. 10A through 10C).

In FIG. 10A, the supplementary gas nozzle holder 51 is formed horizontally, thereby injecting gas horizontally from the adapter 30. In FIG. 10B, the supplementary gas nozzle holder 51 slopes downward from the adapter 30, thereby injecting gas at a downward angle from the adapter 30. In FIG. 10C, the supplementary gas nozzle holder 51 slopes upward from the adapter 30, thereby injecting gas at an upward angle from the adapter 30.

In FIGS. 10A through 10C, only the supplementary gas nozzle holders 51 are formed in the adapters 30 and are positioned in the center of the adapters 30. The supplementary gas nozzle holders 51 may also have various injecting configurations as described above.

The gas supplying apparatus 20 according to the second embodiment of the present invention provides a more exact gas injection on the substrate 10 due to the supplementary gas nozzle holders 51 having predetermined lengths.

Figure 11:
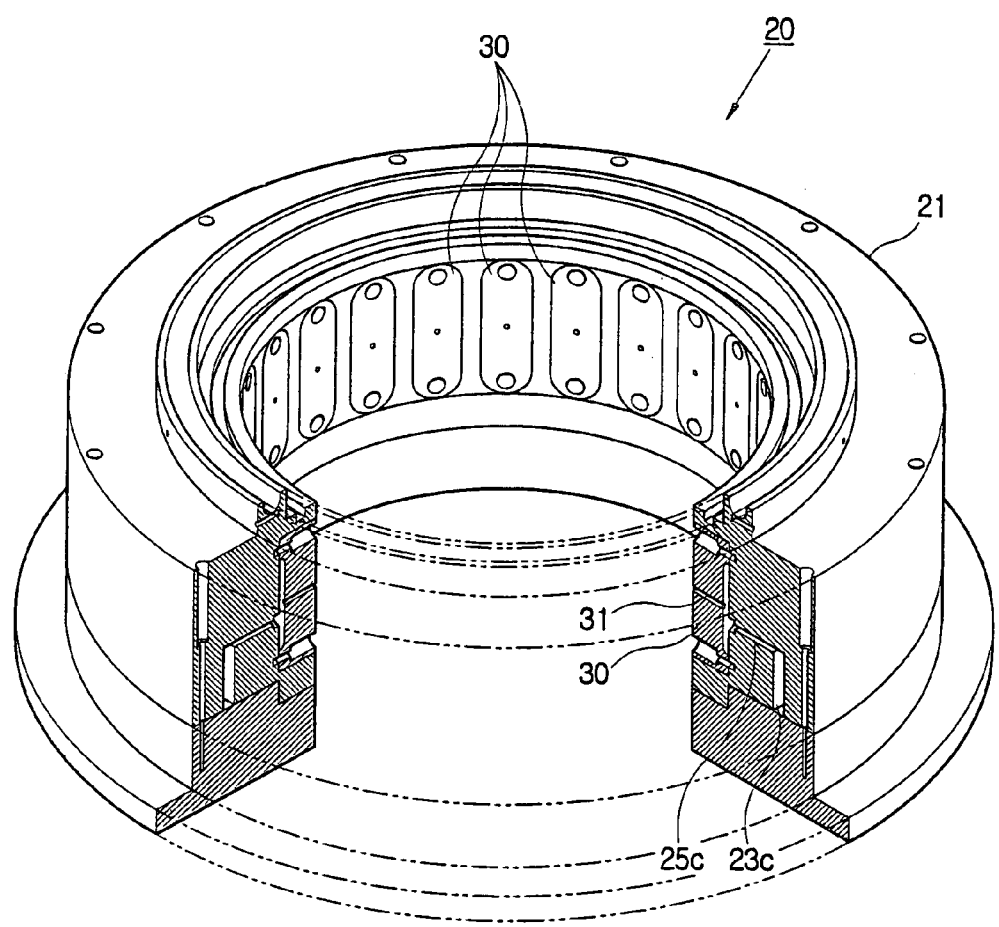
FIG. 11 is a partial cut-away perspective view of a gas supplying apparatus according to a third embodiment of the present invention.
Figure 12:
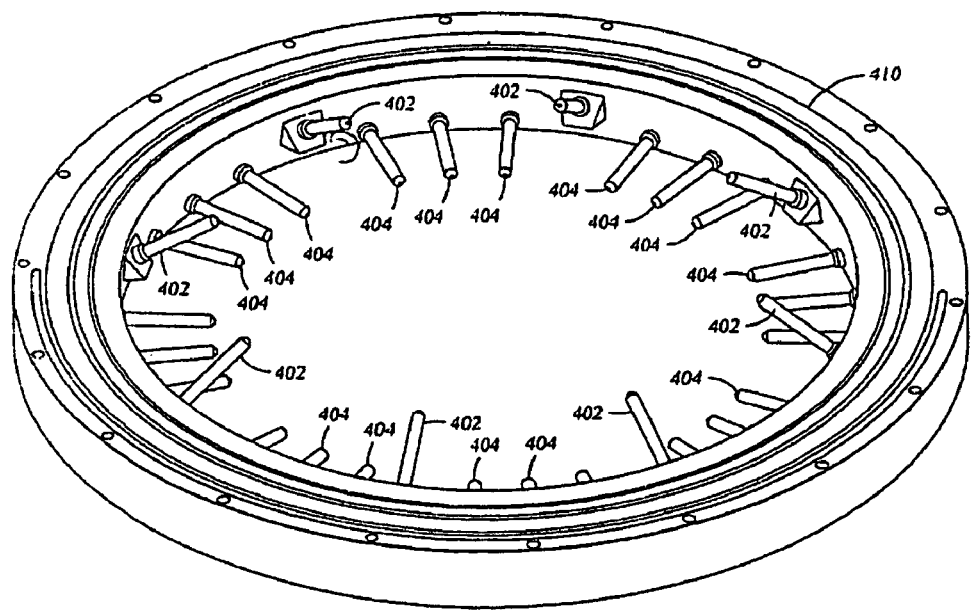
FIG. 12 is a perspective view of a gas supplying ring of a conventional gas supplying apparatus.

FIG. 11 is a perspective view of the gas supplying apparatus 20 according to a third embodiment of the present invention. The gas supplying apparatus 20 of the third embodiment differs from that of the first and the second embodiments in that only one gas supplying channel 23c is formed in the gas supplying ring 21 and a plurality of gas distribution channels 25c are provided to connect to the sole gas supplying channel 23c.

In the third embodiment of the present invention, the adapters 30 having the various configurations may be used as in the first embodiment and the supplementary gas nozzles 50 may be used as in the second embodiment.

In summary, the gas supplying apparatus according to the present invention supplies deposition gas onto a substrate surface and includes a gas supplying ring with one or more gas supplying channels along the interior circumference of the gas supplying ring, a plurality of gas distribution channels in the gas supplying ring formed toward the center of the gas supplying ring and connecting to the gas supplying channels, a plurality of adapters with gas nozzles respectively connecting to the gas distribution channels that are detachably connected to the interior of the gas supplying ring. Further, the plurality of adapters have a variety of gas injection configurations to provide the most suitable and uniform gas distribution onto substrates having various forms.

As described above, according to the present invention, adapters are provided that are easy to attach and detach to and from a gas supplying apparatus and that have gas nozzles with various injection configurations to provide the most suitable and uniform gas injection onto various substrates.

Supplementary gas nozzles may also be included to provide more exact gas injection onto a substrate.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A gas supplying apparatus for supplying deposition gas onto a substrate surface, the gas supplying apparatus comprising:
    a gas supplying ring with a plurality of gas supplying channels formed along the interior of the gas supplying ring and with a plurality of gas distribution channels directed toward a center of the gas supplying ring; and
    a plurality of adapters with gas nozzles to respectively connect to at least one of the gas distribution channels, the adapters detachably connected to the interior of the gas supplying ring;
    wherein the gas nozzles have a variety of injection configurations; and
    each of the adapters are selectively connectable to more than one of the gas distribution channels while connected to the gas supplying ring.

2. The gas supplying apparatus according to claim 1, wherein the injection configuration of the gas nozzles is changed by changing at least one of an injection angle and an injection position.

3. The gas supplying apparatus according to claim 2, wherein each adapter comprises a gas connecting channel connecting to respective gas distribution channels, wherein the gas supplying ring has a plurality of the gas supplying channels, and the adapters are formed vertically to connect to the gas connecting channel.

4. The gas supplying apparatus according to claim 3, further comprising a blocking device selectively blocking the gas distribution channels.

5. The gas supplying apparatus according to claim 4, wherein the blocking device comprises a plurality of blocking members that are selectively inserted into the plurality of gas distribution channels, respectively, to block the plurality of gas distribution channels.

6. The gas supplying apparatus according to claim 5, wherein the gas supplying ring comprises a plurality of adapter accommodating parts to accommodate the adapters, respectively.

7. The gas supplying apparatus according to claim 6, further comprising a plurality of blocking member accommodating parts formed at outlets of the gas distribution channels that respectively accommodate the blocking members.

8. The gas supplying apparatus according to claim 7, further comprising a plurality of supplementary gas nozzles detachably connected to the adapters, respectively, to connect to the gas nozzles.

9. The gas supplying apparatus according to claim 8, wherein each of the adapters comprises a supplementary gas nozzle holder connecting to the gas nozzles, respectively, to hold the supplementary gas nozzles, respectively.

10. The gas supplying apparatus according to claim 9, wherein the supplementary gas nozzles are positioned at predetermined angles with respect to a gas injection direction of the gas nozzles.

11. The gas supplying apparatus according to claim 8, wherein the supplementary gas nozzles extend horizontally into the gas connecting channel toward a center of the gas connecting channel.

12. The gas supplying apparatus according to claim 6, wherein each adapter accommodating part is a cavity in the interior of the gas supplying ring that corresponds to a shape of each respective adapter.

13. The gas supplying apparatus according to claim 5, wherein the blocking members have cylindrical shapes.

14. The gas supplying apparatus according to claim 13, wherein the blocking device comprises 0-rings placed around the respective blocking members to prevent the escape of gas.

15. The gas supplying apparatus according to claim 4, wherein the gas nozzles extend horizontally into the gas connecting channel toward a center of the gas connecting channel.

16. The gas supplying apparatus according to claim 4, wherein the gas nozzles slope downward from the gas connecting channel.

17. The gas supplying apparatus according to claim 4, wherein the gas nozzles slope upward from the gas connecting channel.

18. The gas supplying apparatus according to claim 3, wherein the gas nozzles extend horizontally into the gas connecting channel toward a center of the gas connecting channel.

19. The gas supplying apparatus according to claim 3, wherein the gas nozzles slope downward from the gas connecting channel.

20. The gas supplying apparatus according to claim 3, wherein the gas nozzles slope upward from the gas connecting channel.

21. The gas supplying apparatus according to claim 3, wherein the gas supplying channels respectively supply different gases.

22. The gas supplying apparatus according to claim 21, wherein the gas supplying channels comprise a first gas supplying channel and a second gas supplying channel, and the gas distribution channels comprise a first gas distribution channel and a second gas distribution channel, wherein the first gas distribution channel connects to the first gas supplying channel to supply a first gas from the first gas supplying channel, and the second gas distribution channel connects to the second gas supplying channel to supply a second gas from the second gas supplying channel.

23. The gas supplying apparatus according to claim 22, wherein the gas connecting channel is a cavity in each adapter that is adjacent to an outlet of the first gas distribution channel and to an outlet of the second gas distribution channel to connect the first gas distribution channel and the second gas distribution channel to the gas nozzle of the adapter.

24. The gas supplying apparatus according to claim 4, wherein the blocking device is a valve to selectively block the gas distribution channels.

25. The gas supplying apparatus according to claim 3, wherein the gas nozzles extend horizontally toward the gas connecting channel, the gas nozzles being positioned in an upper part of the adapter or in a lower part of the adapter.

26. The gas supplying apparatus according to claim 3, wherein the gas nozzles slope toward the gas connecting channel and are positioned in an upper part of the adapter or in a lower part of the adapter.

27. The gas supplying apparatus according to claim 1, wherein the gas supplying ring comprises an upper part and a lower part, the upper part and the lower part being combined to form the gas supplying channels.

28. A gas supplying apparatus for supplying gas onto a substrate, comprising:
   a gas supplying ring comprising;
      a gas supplying channel formed in an interior of the gas supplying ring, and
      a plurality of gas distribution channels connecting to the gas supplying channel and extending toward a center of the gas supplying ring;
   a plurality of adapters with gas nozzles to respectively connect to at least one of the gas distribution channels, the adapters detachably connected to the gas supplying ring so as to be selectively connectable to more than one of the gas distribution channels; and
   a plurality of supplemental gas nozzles detachably connected to the gas nozzles of the adapters, respectively, at various injection angles.

29. A method of supplying gas to a substrate using a gas supplying apparatus, the gas supplying apparatus having a gas supplying ring with a first gas distribution channel and a second gas distribution channel, detachable adapters with gas nozzles having various injection positions and injection angles with respect to the adapters, the gas nozzles connecting to the first gas distribution channel and the second gas distribution channel, the method comprising:
   blocking one of the first gas distribution channel and the second gas distribution channel;
   determining a desired gas nozzle injection position and injection angle according to a type of the substrate;
   selecting ones of the adapters according to the desired gas nozzle injection position and injection angle;
   attaching the selected adapters to the gas ring; and
   injecting gas toward the substrate through the selected adapters according to the desired gas nozzle injection position and injection angle.

30. A gas supplying apparatus to supply deposition gas onto a substrate surface, the gas supplying apparatus comprising:
   a gas supplying ring with a plurality of gas supplying channels formed along the interior of the gas supplying ring and with a plurality of gas distribution channels directed toward a center of the gas supplying ring;
   a plurality of adapters with gas nozzles connecting to the gas distribution channels, respectively, that detachably connect to the interior of the gas supplying ring; and
   a blocking device selectively blocking the gas distribution channels;
   wherein the gas nozzles have a variety of injection configurations; and
   the blocking device comprises a plurality of blocking members that are selectively inserted into the plurality of gas distribution channels, respectively, to block the selected gas distribution channels.

31. A gas supplying apparatus to supply deposition gas onto a substrate surface, the gas supplying apparatus comprising:
   a gas supplying ring with a plurality of gas distribution channels directed toward a center of the gas supplying ring; and
   a plurality of adapters with gas nozzles detachably connected to the gas supplying ring to respectively connect to at least one of the gas distribution channels;
   wherein at least one of the adapters is selectively connectable to more than one of the gas distribution channels while connected to the gas supplying ring.

* * * * *

UNITED STATES PATENT AND TRADEMARK OFFICE
CERTIFICATE OF CORRECTION

| | | |
|---|---|---|
| PATENT NO. | : 7,303,141 B2 | Page 1 of 1 |
| APPLICATION NO. | : 10/801852 | |
| DATED | : December 4, 2007 | |
| INVENTOR(S) | : Kyu-hee Han et al. | |

It is certified that error appears in the above-identified patent and that said Letters Patent is hereby corrected as shown below:

Column 8, Line 12, change "0-rings" to --O-rings--.

Signed and Sealed this

First Day of July, 2008

JON W. DUDAS
*Director of the United States Patent and Trademark Office*